United States Patent [19]
Tsai

[11] Patent Number: 5,235,204
[45] Date of Patent: Aug. 10, 1993

[54] REVERSE SELF-ALIGNED TRANSISTOR INTEGRATED CIRCUIT

[75] Inventor: Nun-Sian Tsai, Hsin, Taiwan

[73] Assignee: Taiwan Semiconductor Manufacturing Company, Hsin, Taiwan

[21] Appl. No.: 742,369

[22] Filed: Aug. 8, 1991

Related U.S. Application Data

[62] Division of Ser. No. 572,871, Aug. 27, 1990, Pat. No. 5,071,780.

[51] Int. Cl.$^5$ .................... H01L 29/10; H01L 29/78
[52] U.S. Cl. .................... 257/408; 257/344; 257/401
[58] Field of Search ............ 357/34, 41, 23.9; 257/408, 344, 336, 401

[56] References Cited

U.S. PATENT DOCUMENTS

| | | | |
|---|---|---|---|
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,256,514 | 3/1981 | Pogge | 148/1.5 |
| 4,366,613 | 1/1983 | Ogura et al. | 29/571 |
| 4,378,627 | 4/1983 | Jambotkar | 29/571 |
| 4,419,810 | 12/1983 | Riseman | 29/571 |
| 4,546,535 | 10/1985 | Shepard | 29/571 |
| 4,641,170 | 2/1987 | Ogura et al. | 357/35 |
| 4,782,030 | 11/1988 | Katsumata et al. | 437/33 |
| 4,800,171 | 1/1989 | Iranmanesh et al. | 437/31 |
| 4,812,417 | 3/1989 | Hirao | 437/31 |
| 4,851,362 | 7/1989 | Suzuki | 437/31 |
| 4,916,083 | 4/1990 | Monkowski et al. | 437/31 |
| 4,996,581 | 2/1991 | Hamasaki | 357/34 |
| 5,014,107 | 5/1991 | Vora | 357/44 |

FOREIGN PATENT DOCUMENTS

| | | | |
|---|---|---|---|
| 54-102980 | 8/1979 | Japan | 357/23.9 |
| 60-117664 | 6/1985 | Japan | 357/34 |
| 61-158173 | 7/1986 | Japan | 357/34 |
| 63-281463 | 11/1988 | Japan | 357/34 |

OTHER PUBLICATIONS

Muller & Kamins, "Device Electronics for Integrated Circuits" © 1986, pp. 71–72.

Primary Examiner—Jerome Jackson
Assistant Examiner—D. Monin
Attorney, Agent, or Firm—George O. Saile

[57] ABSTRACT

A method of forming self-aligned transistors which may be either bipolar or field effect is described. A heavily doped conductive layer of one conductivity type is formed upon a monocrystalline semiconductor substrate of the opposite conductivity type to that of the one type. The conductive layer may be polycrystalline silicon, tungsten silicide, titanium nitride or the like. An insulator layer is formed upon the surface of the conductive layer. Openings with substantially vertical sidewalls are formed through the conductive layer to the semiconductor substrate in at least the locations of the first element of the transistors to be formed. The structure is heated to form the heavily doped portions of the second element of said transistors of the one conductivity type by outdiffusing from the conductive layer. Controlled oxidation of the exposed substrate and sidewalls of the conductive layer is done until the desired low doped portion of the heavily doped portions of the second element of the transistor has been formed under the oxidized semiconductor substrate. This second element is the base where a bipolar transistor is being formed and the source/drain where a field effect transistor is being formed. A uniform thickness conformal insulating layer is then deposited on the insulator layer over the conductive layer and oxidized substrate and preferentially removing the insulating layer from the horizontal surfaces and leaving a sidewall insulating layer upon the substantially vertical sidewalls. The integrated circuit is completed and the appropriate electrical contacts are made to the elements of the transistors of the integrated circuit.

9 Claims, 2 Drawing Sheets

REVERSE SELF-ALIGNED TRANSISTOR INTEGRATED CIRCUIT

This is a division of application Ser. No. 07/572,871 filed Aug. 27, 1990 now U.S. Pat. No. 5,071,780 dated Dec. 10, 1991.

BACKGROUND OF THE INVENTION

1. Field of the Invention

This invention relates to semiconductor integrated circuit structures and to methods for manufacturing such integrated circuits wherein self-aligned transistor structures are formed.

2. Description of the Prior Art

The self-aligned silicon gate field effect transistor process and resulting structure has been a standard in the industry for some time. The process involves growing an insulating layer over the semiconductor substrate and then forming a polysilicon layer thereover. Lithography and etching techniques are used to remove all of the polysilicon layer except in the areas where the field effect transistor gates are to be located in the integrated circuit structure. This resulting gate structure is now used as a mask for forming the source/drain of the transistor in what is termed a self-aligned structure.

Improvements have been made in the self-aligned processing and structures. These improvements are particularly important in the manufacture of submicron integrated circuits.

One such improvement field has been for methods to form narrow dimensioned, for example submicron regions on a semiconductor body. Reference is made to the I. T. Ho et al U.S. Pat. Nos. 4,209,349 and 4,209,350, K. Riseman U.S. Pat. No. 4,234,362 and the H. B. Pogge U.S. Pat. No. 4,256,514 which describe the formation of such regions. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way such a narrow dimension region of one micrometer or less is obtained.

Another improved self-aligned gate structure is the lightly doped drain or LDD. For example, where the LDD in an N channel MOS FET is included, in addition to the channel separating implanted N+ source and drain regions, the submicron diffused N− regions. These N− regions increases the channel breakdown voltage and reduces drain junction electron impact ionization (and thus, hot electron emission) by spreading the high electric field at the drain pinch-off region into the N− region. One improved process for making such an LDD device is described in the S. Ogura et al U.S. Pat. No. 4,366,613 in which the N− region is first formed using the polysilicon gate as the mask, submicron sidewall spacers are formed on the sides of the polysilicon gate, and the N+ source/drain regions are formed by ion implantation using the gate and sidewall spacer structure as the mask which results in the N− LDD structure. Other lightly doped drain structures and methods are shown by the I. T. Ho et al U.S. Pat. Nos. 4,209,349 and 4,209,350.

The reverse self-aligned field effect transistor process has been suggested by a limited number of workers in the field. Reference is made to the U.S. Pat. Nos. 4,296,426 to Thomson CSF, 4,378,627 to C. G. Jambotkar, 4,419,810 to J. Riseman and 4,546,535 to C. G. Jambotkar. These patents generally describe the reverse process wherein a heavily doped conductive layer such as polycrystalline silicon or the like is formed upon a silicon substrate and an insulator layer formed thereover. This multilayer structure is etched to result in a patterned conductive polycrystalline layer or the like with substantially vertical sidewalls. The pattern of the conductive layer is chosen to be located above the planned source/drain regions with openings in the pattern at the location of the field effect transistor's channel. A sidewall insulator spacer can now be formed on the vertical sidewalls as described, for example in the previous paragraphs. The sidewall layer may be doped with conductive imparting impurities. The gate dielectric is formed on the channel surface. The source/drain region and preferably lightly doped region are simultaneously formed by thermal drive-in from the conductive first polycrystalline silicon layer or the like and insulator sidewall layer respectively. The desired gate electrode is formed upon the gate dielectric and electrical connections made to the various elements of the field effect transistor devices.

It is therefor an object of this invention to make improvements in the reverse self-aligned process and resulting devices useful in the submicron integrated circuit technology.

A further object of the invention is to make improvements in the reverse self-aligned process for making submicron LDD MOSFET integrated circuits.

It is a still further object of this invention to make improvements in the reverse self-aligned process for making submicron bipolar integrated circuits.

SUMMARY OF THE PRESENT INVENTION

In accordance with the present invention a method of forming self-aligned transistors which may be either bipolar or field effect is described. A heavily doped conductive layer of one conductivity type is formed upon a monocrystalline semiconductor substrate of the opposite conductivity type to that of the one type. The conductive layer may be polycrystalline silicon, tungsten silicide, titanium nitride or the like. An insulator layer is formed upon the surface of the conductive layer. Openings with substantially vertical sidewalls are formed through the conductive layer to the semiconductor substrate in at least the locations of the first element of the transistors to be formed. The structure is heated to form the heavily doped portions of the second element of said transistors of the one conductivity type by outdiffusing from the conductive layer. Controlled oxidation of the exposed substrate and sidewalls of the conductive layer is done until the desired low doped portion of the heavily doped portions of the second element of the transistor has been formed under the oxidized semiconductor substrate. This second element is the base where a bipolar transistor is being formed and the source/drain where a field effect transistor is being formed. A uniform thickness conformal insulating layer is then deposited on the insulator layer over the conductive layer and oxidized substrate and preferentially removing the insulating layer from the horizontal surfaces and leaving a sidewall insulating layer upon the substantially vertical sidewalls. The integrated circuit is completed and the appropriate electrical contacts are made to the elements of the transistors of the integrated circuit.

A self-aligned transistor integrated circuit device structure is also envisioned by this invention. This structure includes a silicon semiconductor substrate having dielectric regions that isolate semiconductor surface regions from one another. Heavily doped regions of one conductivity are located in at least some of the semiconductor surface regions which are of an opposite conductivity. Directly above the heavily doped regions are heavily doped conductive layers which are of the same one conductivity and the source of the dopant in the heavily doped regions. There are substantially vertically sided openings in the heavily doped layers having insulating sidewall layers on the vertically sided openings. There are no heavily doped regions in the said semiconductor surface regions under the opening. Thermal silicon dioxide regions are at the surface and on the inner periphery of the heavily doped regions near the openings. Lightly doped regions of the one conductivity are located directly under the thermal silicon dioxide regions. Means are provided for connecting the remaining element of the transistors. Appropriate electrical contact means are made to the elements to form the completed integrated circuit structure. Both bipolar and field effect transistor device structures are envisioned.

DISCLOSURE OF THE INVENTION

Referring now more particularly to FIGS. 1 through 5 there is shown a first embodiment for making a submicron field effect transistor in a high density integrated circuit structure. The process is illustrated to form a N channel, lightly doped drain (LDD) MOSFET integrated circuit. However, it should be understood that a P channel field effect transistor can be formed by simply reversing the polarity of the various elements of the transistors and associated regions.

Figure 1:
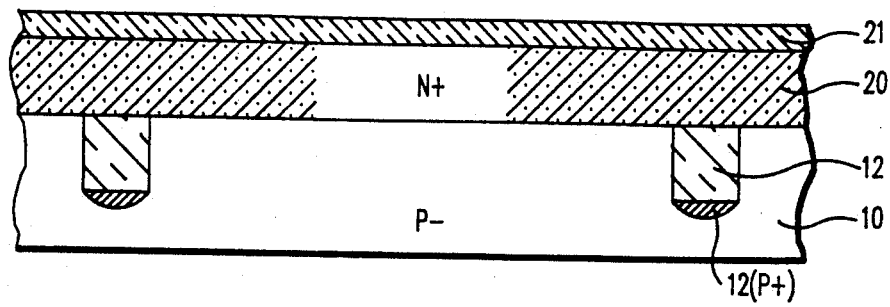
FIGS. 1 through 5 schematically illustrate in a vertical cross-sectional representation the process for forming a self-aligned, submicron field effect transistor integrated circuit structure.

The first series of steps involve the formation of the dielectric isolation regions for isolating semiconductor surface regions from other such regions. The semiconductor substrate 10 may be composed of any of the various known semiconductor materials, but is preferably composed of silicon having a (100) crystallographic orientation. The substrate 10 in this example is doped P− as seen in FIG. 1. The dielectric isolation regions 12 may be formed by the various conventional methods understood by those skilled in the field. One method is described by E. Kooi in U.S. Pat. No. 3,970,486 wherein the certain selected surface portions of a silicon semiconductor substrate is masked against oxidation, and then the exposed unmasked surface is oxidized to grow a thermal oxide which in effect sinks the silicon surface at the unmasked areas. The masked silicon remains as a mesa surrounded by the sunken oxide. Then semiconductor devices can be provided by various known techniques in the silicon mesas. A second and preferred method for submicron integrated circuit devices is described by J. A. Bondur et al. in U.S. Pat. No. 4,104,086 can be used to form the dielectric regions 12. A P+ region 14 is usually formed under the dielectric isolation region 12 to prevent a formation of an inversion layer and the resulting electrical leakage between isolated monocrystalline surface regions under the dielectric regions 12.

The dielectric isolation regions 12, 14 may be formed according to the Bondur et al technique by first thermally oxidizing the surface of the silicon substrate 10 to form silicon dioxide layer (not shown) thereon. A silicon nitride layer (not shown) is then deposited thereover by chemical vapor deposition. The silicon nitride layer then has openings formed therein at the desired locations of the dielectric isolation regions by conventional lithography and etching techniques. Openings are formed in the silicon dioxide layer using the silicon nitride layer as a mask. Then the structure is subjected to a reactive plasma to etch the silicon to a desired depth using the silicon nitride-silicon dioxide layers as a mask. The etched grooves are filled with the desired dielectric such as thermally grown silicon dioxide, chemical vapor deposited silicon dioxide, polysilicon, monocrystalline silicon, glass, silicon nitride or organics such as polyimides or the like either singularly or in combinations before or after the formation of device structures. One example of a filled dielectric groove is a thermal dioxide layer on the trench sidewalls with the remaining filling being polycrystalline silicon. The P+ region 14 is formed by the ion implantation of boron before the groove is filled with the dielectric materials. The silicon dioxide and silicon nitride layers are now removed from the surface of the silicon substrate. The surface dielectric isolation regions 12, 14 are now completed.

A first layer 20 of polycrystalline silicon is deposited over the entire surface having the dielectric isolation pattern 12. The layer 20 is deposited by conventional methods at preferably as low a temperature as possible. The polycrystalline silicon can be deposited either doped or undoped and subsequently doped by an ion implantation process using phosphorous to form N+ or boron to form P+ polysilicon. However, in the present example the N+ doped polysilicon is required. It is preferred to use the process of deposition of the undoped polysilicon and subsequent ion implantation of phosphorous. The thickness of the polysilicon layer is preferably between about 0.2 and 0.5 micrometers and is typically 0.3 micrometers. A silicon dioxide layer 21 is now deposited thereover by any conventional technique, but preferably by plasma oxide deposition at about 350° C. It is preferably between about 0.2 and 0.5 micrometers in thickness and is typically 0.3 micrometers.

Figure 2:
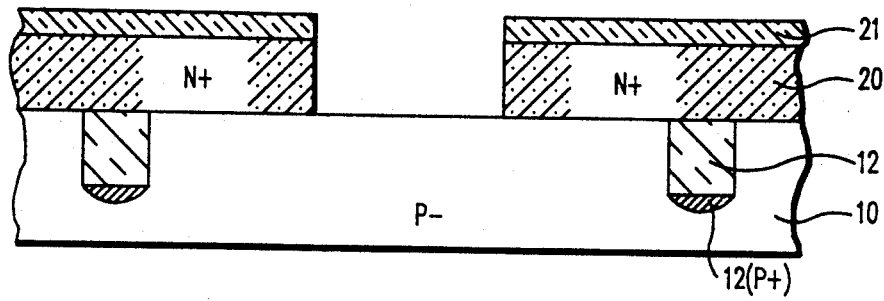

Referring now more particularly to FIG. 2, the layer 21 is etched by standard lithography and etching techniques to form the desired openings therein. The silicon dioxide layer 21 is then used as a mask to form the opening in the polysilicon layer 20 as shown in FIG. 2. The etching of the polycrystalline silicon layer 20 is by an anisotropic etching process as is known in the art to obtain substantially vertical sided opening in this layer 20. The pattern of openings in layers 20, 21 are chosen to be located above the location of the field effect transistor's channel and the planned source/drain regions under the remaining layers and adjacent to the channel areas.

The N+ source/drain regions 30 are now formed by annealing the FIG. 2 structure of between about 900° C. to 1000° C. until the N+P+ junction is about 0.3 to 0.6 micrometers below the surface. Annealing is done in an nitrogen atmosphere for about 60 minutes.

Figure 3:
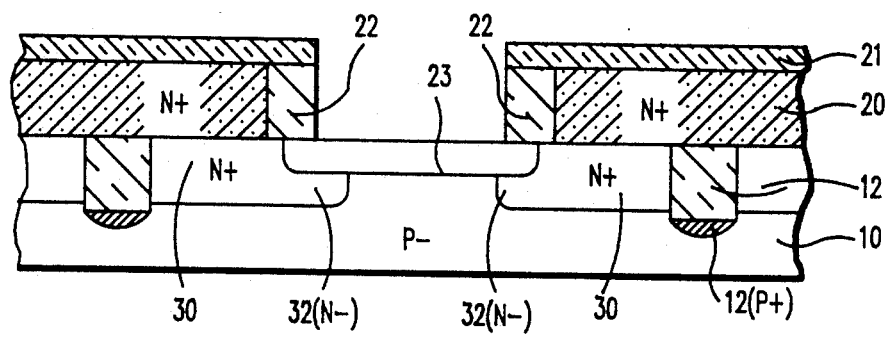

The next series of steps will produce the FIG. 3 structure. The FIG. 2 structure is subjected to a carefully controlled thermal oxidation step in oxygen or water vapor at a temperature of about 970° C. until about 0.4+0.02 micrometers of silicon dioxide is grown from the polysilicon layer 20 to produce oxide region 22 and from the substrate 10 to produce the oxide region 23. The effect of the oxidation region 23 is to consume the most heavily doped upper portion of the N+ doped region of the source/drain contiguous to the planned channel. This leaves the desired N— regions 32 under the oxide region 23.

Figure 4:
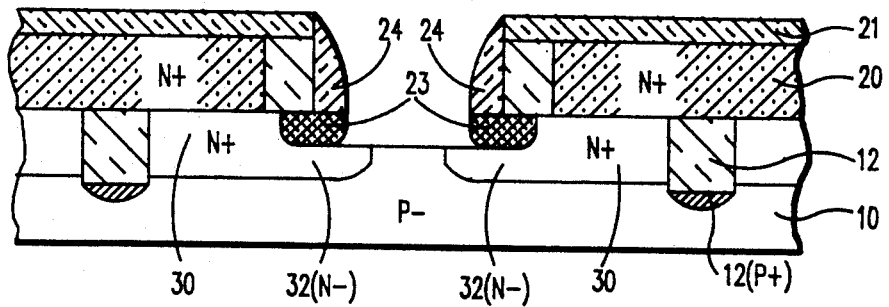

A sidewall insulator layer or spacer 24 is formed upon the vertical sidewalls of the silicon dioxide layer 22. This layer 24 is preferably silicon dioxide, but could alternatively be composed of silicon nitride or the like or a combination of silicon dioxide and silicon nitride. The sidewall layer 24 may be formed by a conformal chemical vapor deposition process wherein silicon hydride, oxygen at about 450° C. or silicon bichloride and nitrogen dioxide at about 800° C. at atmospheric or low pressure conditions are used. Alternatively, the conventional TEOS process at a temperature of 720° C. is used to deposit silicon dioxide from the ambient. The resulting conformal layer is deposited over the layer 21, sidewalls 22 of the opening and the bottom of the opening over layer 23. This conformal layer which is not shown in the drawings is now subjected to an anisotropic etching process for silicon dioxide or whatever the conformal layer is composed of. The conformal layer thickness is preferred to be about 0.2+0.01 micrometers. The process continues until the horizontal portions of the conformal layer has been removed and only the remaining vertical portions of the conformal layer 24 remains as seen in FIG. 4. The etching may be done, for example in a reactive ion etching system using carbon tetrafluoride and hydrogen as described in L. M. Ephrath, J. Electrochem. Soc, Vol. 124, p.284C (1977). The result of the etching step is to remove about 0.5+0.04 micrometers of silicon dioxide which leaves about 0.1+0.07 micrometers in the gate region. A wet hydrofluoric acid etch is used to remove this remaining silicon dioxide in the gate region in preparation for forming the gate dielectric. The result of these processes is shown in FIG. 4.

The gate dielectric layer 40 of the field effect transistor is formed by thermal oxidation in an oxidizing atmosphere such as oxygen or oxygen/water vapor ambient at about 950° C. The preferred thickness of the gate dielectric layer 40 is between about 0.025 and 0.01 micrometers.

Figure 5:
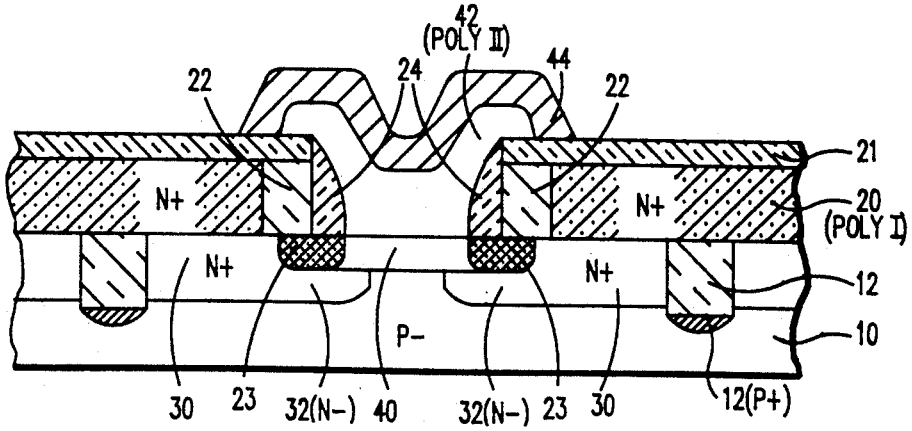

The gate electrode for each of the field effect transistors is now formed over the gate dielectric and the insulating layer 21 and delineation is made by conventional lithography and etching techniques to form the gate layer 42. FIG. 5 shows the delineated gate electrode 42 with its insulating layer 44 formed by conventional methods thereover. The compositions of the gate electrode is preferably doped polycrystalline silicon, but could alternatively be metals, silicides or the like. Where the gate electrode is polycrystalline silicon, it could be formed in a similar fashion to that of the first polycrystalline layer 20 described above. The preferred thickness of this electrode layer 42 is the same as that of layer 20, that is about 0.3 micrometers.

A higher level of metallurgy (not shown) is used to contact the source/drain contacts 20 and the gate electrode 42. Preferably this level of metallurgy is composed of aluminum or the like. Passivation and insulation between the metallurgy levels may be by sputtered or plasma deposited silicon dioxide or the like.

Figure 6:
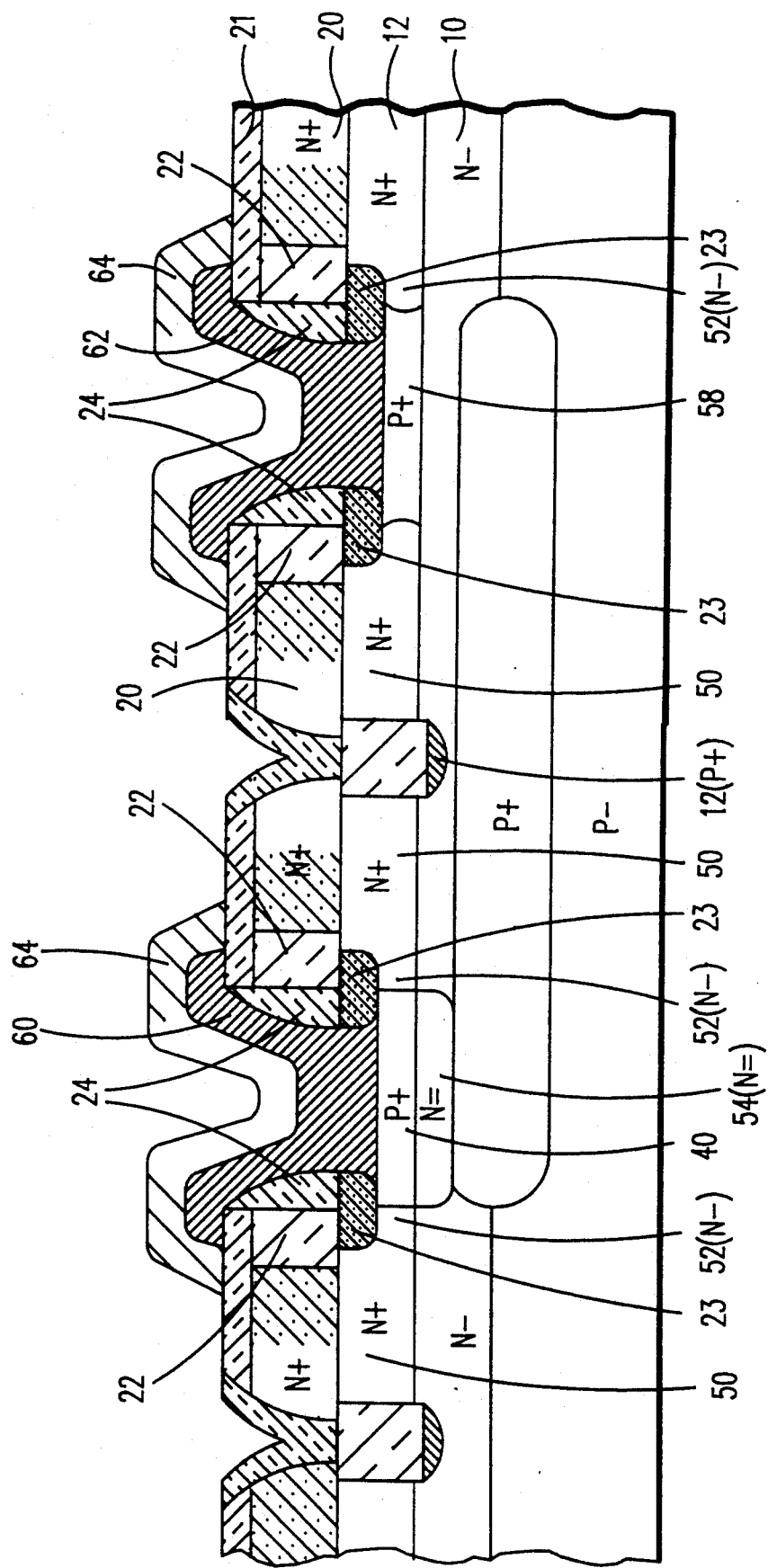
FIG. 6 schematically illustrates a vertical cross-sectioned self-aligned, submicron bipolar which has been formed using a similar process to that of the FIGS. 1 through 5 process.

Referring now more particularly to FIG. 6, there is shown the resulting vertical PNP bipolar integrated circuit structure from a process that is a variation to that of the FIG. 1 through 5 embodiment. A vertical NPN bipolar structure could of course be fabricated by changing the conductivities of the regions involved in the process as is understood by those skilled in the art. This bipolar embodiment process proceeds in a similar fashion to that of the first embodiment and like numbers indicate like elements for both embodiments. However, the major difference is the necessity of the P+ subcollector and the N— epitaxial layer upon the P— substrate which form the substrate 10 of the FIG. 6 embodiment. As is well known in the art, this epitaxial layer is formed over the entire P— substrate. A P+ region is formed in the substrate where the bipolar devices are to be formed before the epitaxial layer growth and this P+ subcollector region is formed during the epitaxial growth by outdiffusion. The process of FIG. 1 through 4 remain substantially the same except that the N+ doping for the layer 20 is chosen for a resulting outdiffusion to form the base 50 of the bipolar transistor and an opening is made for the collector at the same time that the emitter opening is made. The oxidation process produces a narrowed and lowered doped N-base region contiguous to the planned emitter region. When it is desired to form region 54 (N— —) by ion implanting, it is necessary to use a conventional block-out mask over the collector region to avoid ion implantation of N— —impurities in the collector region. The P+ emitter region 56 is implanted at the same time as P+ collector contact region 58. Alternatively, the P+ emitter and collector region can be formed by outdiffusion from a deposited and heavily P+ doped polysilicon II layer. The polysilicon II layer is then delineated to form the contacts to the emitter and collector regions.

The second polycrystalline silicon layer or the like emitter contact layer 60 and collector contact layer 62 may be now deposited in a similar fashion to that of the first polycrystalline silicon layer 20 described above. The second polycrystalline layer is blanket deposited over the emitter, collector and oxide layer 21 and then it is delineated by conventional lithography and etching techniques. The delineated layer is then thermally oxidized or has an insulating layer 64 formed thereover which results in the FIG. 6 PNP bipolar integrated circuit structure. Obviously, by the interchanging of the N and P regions of the FIG. 6 PNP vertical bipolar device, it is possible to form a NPN vertical bipolar device.

As with the FIG. 1 through 5 embodiment, above this FIG. 6 embodiment requires a higher level of metallurgy (not shown) to contact the elements of the transistors, that is the emitter electrode 60, the base contact layer 20 and the collector electrode 62. This metallurgy level is preferably aluminum or the like. Passivation and insulation between the metallurgy levels are required in a similar way to that of the first embodiment.

To further improve the conductivity of the device, the first and second polycrystalline silicon layers may be replaced with refractory metal silicide, such as tungsten silicide, tantalum silicide, palladium silicide or the like, and/or in combination with doped polycrystalline silicon.

While the invention has been particularly shown and described with reference to the preferred embodiments thereof, it will be understood by those skilled in the art that various changes in form and detail may be made therein without departing from the spirit and scope of the invention.

What is claimed is:

1. A self-aligned transistor integrated circuit structure comprising:

a silicon semiconductor substrate having a top major surface with dielectric regions that extend below the major surface that isolate semiconductor regions that are adjacent the major surface from one another;

at least two heavily doped regions of one conductivity that are spaced from each other in at least some of said semiconductor regions which are of an opposite conductivity;

directly above said heavily doped regions and above said major surface are heavily doped conductive layers which are of the same one conductivity as said heavily doped regions;

substantially vertical sides on said heavily doped layers above said spaced heavily doped regions;

said vertical sides each having an insulating sidewall layer;

said insulating sidewall layers defining vertically sided openings in said heavily doped layers;

thermal silicon dioxide regions extending from the said major surface and into and partially through said heavily doped regions, and being located beneath said insulating sidewall layers of the said heavily doped regions;

lightly doped regions of said one conductivity directly under said thermal silicon dioxide regions;

means for connecting the remaining elements of said transistors; and electrical contact means to said elements to form said integrated circuit structure.

2. The integrated circuit structure of claim 1 wherein said thermal silicon dioxide regions, and said lightly doped regions under said thermal silicon dioxide regions are formed by thermally oxidizing the inner periphery portion of said heavily doped regions which consumes an inner peripheral portion and leaves said lightly doped regions under said thermal silicon oxide.

3. The integrated circuit structure of claim 1 wherein said heavily doped conductive layers are composed of polysilicon and said insulating sidewall layer is oxidized polysilicon.

4. The integrated circuit structure of claim 3 wherein said insulating sidewall layer has a thickness of more than about 0.4 micrometers.

5. A self-aligned field effect transistor integrated circuit structure comprising:

a silicon semiconductor substrate having a top major surface, with dielectric regions that isolate semiconductor surface regions that are adjacent the major surface from one another;

heavily doped and spaced source/drain regions of one conductivity in at least some of said semiconductor surface regions which are of an opposite conductivity;

directly above said heavily doped and spaced source and drain regions are heavily doped and spaced conductive layers which are of the same one conductivity as said spaced source and drain regions;

substantially vertical sides on said spaced heavily doped conductive layers that define self-aligned gate openings in said heavily doped layers;

said sides each having an insulating sidewall layer;

thermal silicon dioxide regions extending from said top major surface into and partially through said heavily doped regions, and being located beneath said insulating sidewall layers of the said heavily doped regions;

lightly doped regions of said one conductivity directly under said thermal silicon dioxide regions;

a gate dielectric below said top major surface and in said gate opening between said thermal silicon dioxide regions;

a gate electrode over said gate dielectric and in said opening; and means for electrically contacting said source/drain through said heavily doped layers.

6. The integrated circuit structure of claim 5 wherein said conductive layer is N+ polycrystalline silicon, and said heavily doped source/drain regions are N+, and said lightly doped regions are N−.

7. The self-aligned field effect transistor integrated circuit structure of claim 5 wherein said thermal silicon dioxide regions, and said lightly doped regions under said thermal silicon dioxide regions are formed by thermally oxidizing the inner periphery portion of said heavily doped regions which consumes an inner peripheral portion and leaves said lightly doped regions under said thermal silicon dioxide regions.

8. The self-aligned field effect transistor integrated circuit structure of claim 5 wherein said heavily doped conductive layers are composed of polysilicon and said insulating sidewall layer is oxidized polysilicon.

9. The self-aligned field effect transistor integrated circuit structure of claim 8 wherein said insulating sidewall layer has a thickness of between about 0.38 to 0.42 micrometers.

* * * * *